(12) United States Patent
Iwasa

(10) Patent No.: US 6,389,685 B1
(45) Date of Patent: May 21, 2002

(54) METHOD FOR CURRENT SHARING IN A SUPERCONDUCTING CURRENT LEAD

(75) Inventor: Yukikazu Iwasa, Weston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/329,171

(22) Filed: Jun. 9, 1999

Related U.S. Application Data
(60) Provisional application No. 60/088,621, filed on Jun. 9, 1998.

(51) Int. Cl.$^7$ .............................................. H01R 43/00
(52) U.S. Cl. ........................... 29/825; 29/599; 505/230; 505/231; 505/704; 505/705
(58) Field of Search .......................... 29/825, 599, 854; 505/231, 230, 704, 705

(56) References Cited

U.S. PATENT DOCUMENTS

| | | | |
|---|---|---|---|
| 4,727,346 A | * | 2/1988 | Westphal et al. |
| 5,396,206 A | | 3/1995 | Herd et al. ................. 505/163 |
| 5,686,876 A | | 11/1997 | Yamamoto et al. ......... 335/216 |
| 5,742,217 A | | 4/1998 | Bent et al. .................. 335/216 |
| 6,038,462 A | * | 3/2000 | Snitchler et al. |

FOREIGN PATENT DOCUMENTS

DE   44 30 408   7/1995

OTHER PUBLICATIONS

Design and Production of efficient Leads for 1500–A, 50–Hz service in a 77–4 K temperature gradient by Balaxchandran et al, Advances in Superconductivity VII. Proc Intr Symposium on Superconductivity vol. 2, pp. 1243–1246. Published 1995.*

Application of Sinter Fiorged Bi–2223 bars to 1500–A AC power utility service as high frequency current leads in a 77–4 K temperature gradient, by Balachandrian et al appearing in J. Applied Superconductivity, vol. 3, No. 6 pp. 313–320, 1995.*

John R. Hull, "High–Temperature Superconducting Current Leads," *IEEE Transactions on Applied Superconductivity*, vol. 3, No. 1, 869–875 (Mar. 1993).

Reinhard Heller, et al., "Conceptual Design of a 20–kA Current Lead Using Forced–Flow Cooling and Ag–Alloy–Sheathed Bi–2223 High–Temperature Superconductors," *IEEE Transactions on Applied Superconductivity*, vol. 5, No. 2, 797–800 (Jun. 1995).

* cited by examiner

*Primary Examiner*—Carl J. Arbes
(74) *Attorney, Agent, or Firm*—Hamilton, Brook, Smith & Reynolds, P.C.

(57) ABSTRACT

A current lead including a high-temperature superconductor and a normal conductive component is coupled to a superconducting device. Electric current is delivered through the current lead at a level above the critical current carrying capacity of the high-temperature superconductor, creating a current-sharing mode of conductance through at least part of both the superconducting component and the normal conductive component.

9 Claims, 1 Drawing Sheet

METHOD FOR CURRENT SHARING IN A SUPERCONDUCTING CURRENT LEAD

RELATED APPLICATION

This application claims the benefit of U.S. Provisional Application No. 60/088,621, filed Jun. 9, 1998, the entire teachings of which are incorporated herein by reference.

BACKGROUND OF THE INVENTION

The discovery of high-temperature ceramic superconductors in 1986 ignited an ongoing interest in these materials and their unique properties relating to electric-current conduction and magnetism. When a high-temperature superconductor (HTS) is cooled below its transition temperature, the HTS can transmit a limited amount of electric current with little or no resistance. While in the superconducting state, the superconductor also exhibits promising magnetic mirroring properties which, for example, enable magnetic materials to be levitated above it.

Those superconductors with the highest known heat tolerances must nevertheless be cooled to about 125 K or less to operate satisfactorily as a superconductor. Such refrigeration is often achieved with liquid nitrogen for some materials and with liquid helium where lower temperatures are desired.

Superconducting magnets operated in liquid helium are useful in a variety of applications, such as magnetic resonance imaging, energy storage rings, particle accelerators and maglev trains. The superconducting magnets are energized by current leads with temperatures spanning from 300 K at a warm end to 4.2 K at a cold end where the current lead is coupled with the superconducting magnet.

One type of current lead generally used to energize a superconductingg magnet operated in a bath of liquid helium boiling at 4.2 K is made of copper and has a cross sectional area "optimized" for a given lead length and operating current to minimize the heat flowing into the liquid helium. Each of these "conventional" leads injects heat into liquid helium at a rate of approximately 1 mW/A. Thus, a conventional 5-kA lead with a heat input of 5 W boils off liquid helium at a rate of 7.2 liter/hr. ($\dot{m}_{he}$=0.25 g/s), or a boil-off rate of about 15 liter/hr. for a pair of leads. In terms of the compressor power required to maintain the liquid helium level in the magnet system, a 5-W plower input at 4.2 K can require a minimum of about 2,500 W for a large cryogenic system to as much as 10,000 W for most smaller systems.

Others have used current leads comprising HTS tapes, each tape typically consisting of an HTS layer on a metal substrate. While each of the tapes, alone, has a limited or "critical" current level that it can carry through the HTS in a superconducting mode, the critical current capacity of the lead is additively increased by bonding a sufficient number of HTS tapes (often several hundred) together in a single lead. The number of tapes and other parameters of the lead are selected such that the entirety of the HTS section of the lead can carry the all of its rated transport current in a superconducting mode.

DISCLOSURE OF THE INVENTION

A method of this invention uses a current lead comprising a high-temperature superconductor (HTS) component and a normal conductive component operating in a current-sharing mode under normal operating conditions to energize a superconducting device. In accordance with this method, the current lead is coupled to the superconducting device, and electric current is delivered through the current lead at an amperage above the critical-current-carrying capacity over a region extending from the warm end of the HTS component, meaning that the current is carried not only by the HTS component but also by the normal conductive component. Because of this current-sharing by the normal conductive component, joule heating is dissipated in the region.

"Normal" conduction is defined as conduction in a material, such as a room-temperature conductive metal, with more than trace levels of resistance. The "normal operating conditions" under which the current lead is operated are defined as the typical, intended and roughly-equilibrated cooling and conductance conditions under which the lead operates to supply the necessary current to the superconducting device for a sustainable period of time. These conditions can be contrasted with aberrant or fault conditions which may be predicated, for example, by an unexpected power surge or an emergency loss of coolant.

When all or a part of the HTS section of a current lead operates in the current-sharing mode, the current lead operates with significantly enhanced efficiency over a conventional copper lead. At least two benefits are also provided over the use of an HTS lead operating entirely as a near-zero-resistance superconductor. First, the amount of HTS that is needed is reduced, thereby reducing the current lead's capital cost of production without sacrifice to reduction in the cold end heat load in comparison with that achievable by a "conventional" HTS current lead of the same current rating. Second, the operation of the lead in the current-sharing mode nevertheless ensures stable operation, making the lead well-protected when operated in accordance with this invention.

BRIEF DESCRIPTION OF THE DRAWINGS

The foregoing and other objects, features and advantages of the invention will be apparent from the following, more particular description of preferred embodiments of the invention, as illustrated in the accompanying figures. The drawing is not necessarily to scale, emphasis instead being placed upon illustrating the principles of the invention.

DETAILED DESCRIPTION OF PREFERRED EMBODIMENTS

The features and other details of the method of the invention will now be more particularly described with reference to the accompanying drawing and pointed out in the claims. It will be understood that the particular embodiments of the invention are shown by way of illustration and not as limitations of the invention. The principal features of this invention can be employed in various embodiments without departing from the scope of the invention.

Figure 1:
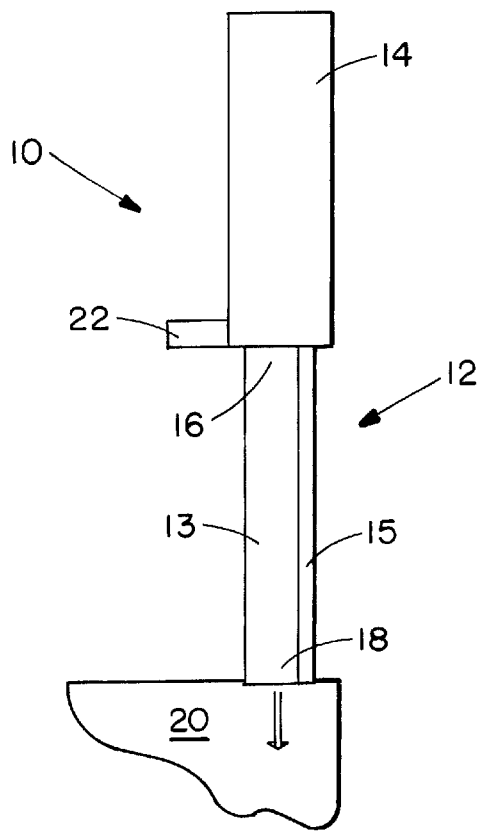
FIG. 1 is a schematic view of a 6-kA current lead suitable for use in a method of this invention.

One embodiment of a current lead for use in a method of this invention is divided into two sections, shown in FIG. 1. The current lead 10 includes a high-temperature superconducting (HTS) section 12 that operates in the temperature range of 4.2 to 80 K, and a copper section 14 that operates in the temperature range of 80 to 300 K as a conventional gas-cooled lead, cooled by a combination of the effluent helium (used to cool the HTS section 12) and additional cold helium vapor or other coolant introduced at the warm end 16 of the HTS section 12. Although the warm-end temperature is typically 80 K, the preferred temperature is a function, dependent, in part, on the composition of the HTS component 13. The HTS section 12 further comprises an HTS component 13, such as bismuth strontium calcium copper oxide (BSCCO, preferably in the form of BSCCO-2223 or -2212), and a normal (resistive) conductive component 15, which is typically a metal, such as silver or silver alloy, in parallel with the HTS component 13.

A cold end 18 of the HTS section 12 is conductively joined to a superconducting device 20, such as a superconducting magnetic energy storage system. Accordingly, the lead 10 serves as the conduit for electric current supply to the superconducting device 20.

Strictly speaking, both low- and high-temperature superconductors are slightly dissipative when carrying a current, AC or even DC, albeit at rates much smaller than those for normal metal. Therefore, HTS leads typically generate some resistance, often as a result of grain boundaries and other anomalies in the crystalline structure. The operation of HTS leads in accordance with the methods of this invention, however, is distinguished by the degree of dissipation within the HTS section 12. For purposes of this discussion, the term, "current-sharing" or "resistive" mode, means that an amount of resistance is generated in the current lead that is substantially greater than that which is generated when all current passes through an HTS component 13 that is operating purely as a superconductor. A current-sharing or resistive mode is established when the HTS section 12 is operated at a current level higher than the critical current of at least part (i.e., a part extending from the warm end 16) of the HTS component 13. Further, for purposes of this discussion, language referring to operation "entirely" or "purely" in a superconducting state does not preclude typical deviations produced by grain boundaries and the like.

The warm end 16 of the HTS section 12 of the current lead 10 is deliberately designed to operate in the resistive mode, with a Joule heating rate, as demonstrated below for a 6-kA lead, in the watts range, which, together with the conduction heating, is to be almost balanced by the effluent helium. In contrast, other "conventional" HTS leads are designed to operate entirely in the superconducting mode, with Joule heating rates at most in the milliwatts range and the effluent helium devoted entirely to almost balance the conduction heating.

This current-sharing mode operation, as the analysis presented herein for a 6-kA lead shows, lowers the volume of HTS tape required with a heat load into the liquid helium environment achievable with a conventional HTS lead of the same rated transport. Because of the high cost of the HTS materials, this reduction in HTS materials is expected to make the capital cost of the lead 10 considerably less than that of other HTS leads.

The use of a current lead 10 in accordance with this invention is suitable in any low-temperature superconducting (LTS) system that contains many magnets operating in liquid helium and at a current in excess of 1 kA. In this disclosure, a 6-kA lead, as shown in FIG. 1, is an example and is used in the thermal analysis, presented below.

The HTS section 12 comprises paralleled BSCCO-2223/Ag—Au composite tapes with $I_{cl}$ (critical current at $T_f$=80K) of 3,000 A. To achieve critical current of 3,000 A at 80K, the number of parallel BSCCO-2223/Ag—Au tapes required is typically 240. This critical current of 3,000 A with 240 parallel BSCCO tapes implies that a conventional HTS current lead rated for 6,000 A will require 480 such tapes. An assembly of BSCCO tapes with a critical current at 80 K, $I_{cl}$, of 3,000 A has a critical current at 4.2K, $I_{co}$, of about 32,000 A. A conventional copper current lead rated 6,000 A has a cold-end heat load of 6 W; a conventional HTS 6-kA current lead, such as the one requiring 480 BSCCO/Ag—Au composite tapes can reduce this 6-W heat load by nearly one order of magnitude—a typical value is 0.7 W or about an 88% saving from 6 W. It is shown here that a 6-kA HTS lead based on this invention with a critical current of 3,000 A (one half the transport current, $I_t$) at 80K not only requires 240 tapes, rather than the 480 parallel BSCCO tapes typically used in a conventional 6-kA HTS current lead, but also can achieve the same saving in heat load as the conventional 6-kA HTS current lead. A heat load of 0.7 W corresponds to a helium boil-off rate of 0.035 g/s.

The copper section 14 of the lead 10 is simply a conventional gas-cooled lead. Because the boil-off rate of the lead 10 is to be less than that required for a conventional lead, the copper section 14 requires additional cooling. The additional cooling is introduced at an 80-K station 22 in the form of cold helium gas. If the helium boil-off rate of the 6-kA lead 10 is to be 0.035 g/s, then the additional helium is introduced at the 80-K station 16 at a rate of 0.215 g/s to make the total flow rate 0.25 g/s.

In the copper section 14, the extra helium introduced at 80 K represents an additional refrigeration requirement at 80 K, $Q_{in}$(80 K), of 92 W, as determined by $Q_{in}(T_w)$= $\dot{m}(T_w)_{he} \times h_{he}(T_w)$, where $T_w$ is the temperature at the warm end of the HTS section, and where $\dot{m}_{he}$(80K)=0.215 g/s and the helium enthalpy at 80 K, $h_{he}$(80K) is 430 J/g. The lead's refrigeration requirements at 4.2 K and 80 K will be discussed, below.

Figure 2:
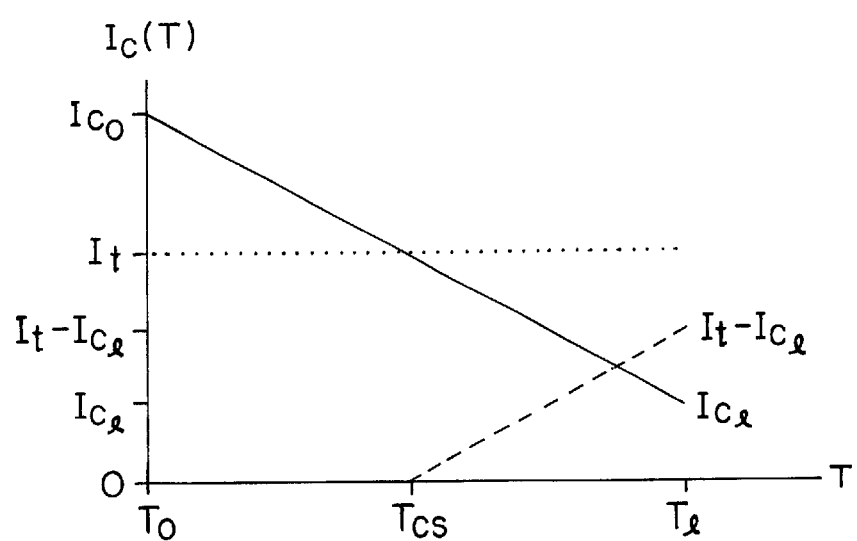
FIG. 2 is a plot with a solid line, approximated to be linear, showing critical current versus temperature in an assembly of silver-sheathed BSCCO-2223 tapes for use in a method of this invention.

The solid line in FIG. 2 shows a critical current versus temperature plot, approximated to be linear with temperature of the assembly of BSCCO-2223/Ag—Au composite tapes in a current lead based on this invention. In FIG. 2, $I_{co}$ (32,000 A) and $I_{cl}$ (3,000 A) are the critical currents of this assembly of HTS tapes, respectively, at $T_o$=4.2K (the cold end) and $T_f$=80 K (warm end). $I_t$ (6,000 A) is the transport current in this current lead and as indicated by the dotted horizontal line in FIG. 2, it is constant over the entire temperature range. As further indicated in FIG. 2, the current-sharing region begins at $T_{cs}$=73.3K, at which point a portion of the transport current begins to be "shared" by the normal, or non-superconducting, metal, as indicated by the dashed line in the figure, increasing linearly with temperature until $T_f$, at which point, the normal-metal component of the lead carries a current of $I_t$–$I_{cl}$=3,000 A. Joule heating is generated in the current-sharing region, between $T_{cs}$ and $T_f$.

A power density differential equation is given for a current lead based on this invention in the superconducting region, spanning from z=0 (at the cold end, where T=$T_o$ to z=$l_{cs}$ (T=$T_{cs}$) by:

$$A_m \frac{d}{dz}\left(\tilde{k}_m \frac{dT}{dz}\right) - \dot{m}_{he} \tilde{C}_p \frac{dT}{dz} = 0 \quad (1)$$

To convert Eq. 1 into a linear differential equation, we make $k_m(T)=\tilde{k}_m$ and $C_p(T)=\tilde{C}_p$, where $\tilde{k}$ and $\tilde{C}$, both constants, are, respectively, the average thermal conductivity of the HTS lead material and average heat capacity of helium vapor, both between $T_o$ and $T_f$. $A_m$ is the cross-sectional area of the HTS lead. If an HTS section of the lead comprises, for example, BSCCO-2223 and silver or silveralloyl, because the thermal conductivity of the silver or silver alloy is much greater than that of BSCCO, $\tilde{k}_m$ is given by the silver's or silver alloy's thermal conductivity alone. Here it is assumed that heat transfer between the HTS lead and helium vapor is perfect and takes place with zero temperature difference.

With the boundary conditions that $T(z=0)$ $T_o$ and $T(z=l_{cs})=T_{cs}$, we have from Eq. 1 an expression for $T(\xi)$, with z normalized to 1 ($\xi=z/l$) and constant materials properties:

$$T(\xi) = \left(\frac{T_{cs} - T_0}{e^{\alpha_{cs}} - 1}\right)\left(e^{\frac{\alpha_{cs}}{\xi_{cs}}\xi} + \frac{e^{\alpha_{cs}}T_0 - T_{cs}}{T_{cs} - T_0}\right) \quad (2)$$

where $\xi_{cs}=l_{cs}/l$ and $$\alpha_{cs} \equiv \frac{\dot{m}_{he}\tilde{C}_p l_{cs}}{\tilde{k}_m A_m} = \ln\left[\frac{\tilde{C}_p(T_{cs} - T_0)}{h_L} + 1\right] \quad (3)$$

Note that $T(\xi=0)=T_o$ and $T(\xi=\xi_{cs})=T_{cs}$.

$Q_{in}$ is given by:

$$Q_{in} = \frac{\tilde{k}_m A_m}{l}\frac{dT}{d\xi}\bigg|_{\xi=0} = \quad (4)$$

$$\dot{m}_{he}\tilde{C}_p\left(\frac{T_{cs} - T_0}{e^{\alpha_{cs}} - 1}\right) = \frac{\tilde{k}_m A_m h_L}{\tilde{C}_p l_{cs}}\ln\left[\frac{\tilde{C}_p(T_{cs} - T_0)}{h_L} + 1\right]$$

The problem thus is reduced to finding $l_{cs}$ for a given $T_{cs}$.

In the current-sharing region that spans between $z=l_{cs}$ at $T_{cs}$ and $z=l$ at $T_l$ (at the warm end of the HTS section), an expression of the power density equation, with the materials properties constant again, is given by:

$$\tilde{k}_m A_m \frac{d^2T}{dz^2} - \dot{m}_{he}\tilde{C}_p\frac{dT}{dz} + \frac{\tilde{\rho}_m I_t(I_t - I_{c_l})}{\tilde{k}_m A_m^2(T_l - T_{cs})}(T - T_{cs}) = 0 \quad (5)$$

where $\rho_m$ is the average electrical resistivity of the normal conductive component. With the boundary conditions, $T(z=l_{cs})=T_{cs}$ and $T(z=l)=T_l$, and again normalizing z with l, $\xi=z/l$, we obtain:

$$T(\xi) = T_{cs} + \frac{(T_l - T_{cs})e^{\frac{\alpha_{cs}}{2\xi_{cs}}\xi}\sin\left[\frac{\beta_{cs}(\xi - \xi_{cs})}{\xi_{cs}}\right]}{e^{\frac{\alpha_{cs}}{2\xi_{cs}}}\sin\left[\frac{\beta_{cs}(1 - \xi_{cs})}{\xi_{cs}}\right]} \quad (6)$$

where $$\beta_{cs} = \frac{\alpha_{cs}\tilde{k}_m}{\dot{m}_{he}\tilde{C}_p}\sqrt{\frac{\tilde{\rho}_m I_t(I_t - I_{c_l})}{\tilde{k}_m(T_l - T_{cs})} - \frac{\dot{m}_{he}\tilde{C}_p}{4\tilde{k}_m}} \quad (7)$$

The only unknown in Eq. 6 is $\xi_{cs}=l_{cs}/l$. This is found by equating the two temperature slopes at $\xi_{cs}=l_{cs}/l$, one deduced from the temperature function (Eq. 2) valid in the superconducting region between $z=0$ and $z=l_{cs}$ and the other deduced from the temperature function (Eq. 6) valid in the current-sharing region between $z=l_{cs}$ and $z=l$.

$$\frac{dT}{d\xi}\bigg|_{l_{cs}}^{s} = \frac{\alpha_{cs}e^{\alpha_{cs}}(T_{cs} - T_0)}{\xi_{cs}(e^{\alpha_{cs}} - 1)} \quad (8A)$$

$$\frac{dT}{d\xi}\bigg|_{l_{cs}}^{cs} = \frac{\beta_{cs}e^{\frac{\alpha_{cs}}{2}}(T_l - T_{cs})}{\xi_{cs}e^{\frac{\alpha_{cs}}{2\xi_{cs}}}\sin\left[\frac{\beta_{cs}(1 - \xi_{cs})}{\xi_{cs}}\right]} \quad (8B)$$

$$\frac{\alpha_{cs}e^{\alpha_{cs}}(T_{cs} - T_0)}{\xi_{cs}(e^{\alpha_{cs}} - 1)} = \frac{\beta_{cs}e^{\frac{\alpha_{cs}}{2}}(T_l - T_{cs})}{\xi_{cs}e^{\frac{\alpha_{cs}}{2\xi_{cs}}}\sin\left[\frac{\beta_{cs}(1 - \xi_{cs})}{\xi_{cs}}\right]} \quad (8C)$$

Equation 8C is rearranged as follows:

$$e^{\frac{\alpha_{cs}}{2\xi_{cs}}}\sin\left[\frac{\beta_{cs}(1 - \xi_{cs})}{\xi_{cs}}\right] = \frac{\beta_{cs}(e^{\alpha_{cs}} - 1)(T_l - T_{cs})}{\alpha_{cs}e^{\frac{\alpha_{cs}}{2}}(T_{cs} - T_0)} \quad (9)$$

Here a lead of this invention (hereafter, "lead A") is used as an illustrative example to demonstrate that it is possible to make a considerable saving in the number of lengths of BSCCO-2223/Ag—Au tape assembled in a 6-kA lead based on this invention through which 6 kA is delivered without any sacrifice in $Q_{in}$.

As a start, the number of BSCCO/Ag—Au tapes in lead A is simply taken to be half that of a conventional HTS 6-kA lead (i.e., 240 lengths of tape versus 480 lengths of tape). From Eq. 3, with $\tilde{C}_p=5.55$ J/gK, $h_L=20.4$ J/g, $T_{cs}=73.3$K and $T_o=4.2$K, we have:

$$\alpha_{cs} = \ln\left[\frac{(5.55 \text{ J/gK})(73.3 \text{ K} - 4.2 \text{ K})}{(20.4 \text{ J/g})} + 1\right] = 2.9856$$

Also from Eq. 7 with $\tilde{k}_m=0.575$ W/cmK, $\rho_m=1.85$ $\mu\Omega$·cm, $T_l - T_{cs}=6.7$ K, and $\dot{m}_{he}$ we have:

$$\beta_{cs} = \frac{2.9856(0.575 \text{ W/cmK})}{(0.035 \text{ g/s})(5.55 \text{ J/gK})}$$

$$\sqrt{\frac{(1.85 \text{ }\mu\Omega\text{cm})(6 \text{ kA})(3 \text{ kA})}{(0.575 \text{ W/cmK})(6.7 \text{ K})} - \frac{(0.035 \text{ g/s})(5.55 \text{ J/gK})}{4(0.575 \text{ W/cmK})}}$$

$$= 25.856$$

With these values of $\alpha_{cs}$ and $\beta_{cs}$, Eq. 9 becomes:

$$\exp\left(\frac{2.9856}{2\xi_{cs}}\right)\sin\left[\frac{25.856(1 - \xi_{cs})}{\xi_{cs}}\right] = \frac{\beta_{cs}(e^{\alpha_{cs}} - 1)(T_l - T_{cs})}{\alpha_{cs}e^{\frac{\alpha_{cs}}{2}}(T_{cs} - T_0)} =$$

$$\frac{25.856(80 \text{ K} - 73.3 \text{ K})[\exp(2.9856) - 1]}{2.9856\exp(2.9856/2)(73.3 \text{ K} - 4.2 \text{ K})} = 3.54758$$

$\xi_{cs} \approx 0.9678$ satisfies Eq. 9 above. Now, solving for $l_{cs}$ from $Q_{in}=\tilde{k}_m \cdot A_m \cdot h_l \cdot \alpha_{cs}/(\tilde{C}_p \cdot l_{cs})$, $A_m=1.5045$ cm$^2$, and $Q_{in}=0.714$W $$l_{cs} = \frac{\tilde{k}_m A_m h_L \alpha_{cs}}{\tilde{C}_p Q_{in}}$$

$$= \frac{(0.575 \text{ W/cmK})(1.5045 \text{ cm}^2)(20.4 \text{ J/g})2.9856}{(5.55 \text{ J/gK})(0.714 \text{ W})} = 13.30 \text{ cm}$$

Thus, we have: $l=l_{cs}/\xi_{cs}=13.74$ cm, which is just about one half of the 28-cm tape length required for a conventional 6-kA HTS current lead.

In the above illustrative example with lead A, $Q_{in}$ was set equal to the heat input, or refrigeration requirement, of a conventional fully-superconducting 6-kA HTS current lead, namely at approximately 0.7 W. Chiefly because the cross-sectional area of lead A is half that of the conventional 6-kA HTS current lead, its total tape length is also about one half that of the conventional HTS current lead resulting in the materials requirement for lead A being about ¼ that of the conventional 6-kA HTS lead.

In another lead of this invention (hereafter, "lead B"), a solution is sought to minimize the value of $Q_{in}$. Accordingly, $Q_{in}$ in this embodiment is less than the approximate 0.7 W achieved both by lead A and by a conventional 6-kA HTS lead. The conduction heat input to lead B is made significantly smaller than that in lead A by setting the sine term in Eq. 6 to zero. Namely, $$\frac{\beta_{cs}(1-l_{cs})}{l_{cs}} = \frac{\pi}{2} \qquad (10)$$

With this condition imposed, Eq. 9 is transformed to:

$$e^{\frac{\alpha_{cs}}{2\xi_{cs}}} = \frac{\beta_{cs}(e^{\alpha_{cs}}-1)(T_l - T_{cs})}{\alpha_{cs} e^{\frac{\alpha_{cs}}{2}}(T_{cs} - T_0)} \qquad (11)$$

Combining Eqs. 10 and 11, we obtain an expression for $l_{cs}$ of lead B with the same parameters as lead A:

$$\frac{(1-\xi_{cs})}{\xi_{cs}} e^{\frac{\alpha_{cs}}{2\xi_{cs}}} = \left(\frac{\pi}{2}\right) \frac{(e^{\alpha_{cs}}-1)(T_l - T_{cs})}{\alpha_{cs} e^{\frac{\alpha_{cs}}{2}}(T_{cs} - T_0)} = 0.21552 \qquad (12)$$

From Eq. 12, $l_{cs}$ is 0.9567 cm. With $l_{cs}$=0.9567 cm and Eq. 10, we now have: $B_{cs}$=34.7063. Accordingly, a new value of $\dot{m}_{he}$ may be derived from Eq. 7.

$$34.7063 = \frac{\alpha_{cs} \tilde{k}_m}{\dot{m}_{he} \tilde{C}_p} \sqrt{\frac{\tilde{\rho}_m I_t (I_t - I_{c_l})}{\tilde{k}_m (T_l - T_{cs})} - \frac{\dot{m}_{he} \tilde{C}_p}{4\tilde{k}_m}} \qquad (13)$$

$$= \frac{2.9856(0.575 \text{ W/cmK})}{\dot{m}_{he}(5.55 \text{ J/gK})}$$

$$\sqrt{\frac{(1.85 \text{ μΩcm})(6 \text{ kA})(3 \text{ kA})}{(0.575 \text{ W/cmK})(6.7 \text{ K})} - \frac{\dot{m}_{he}(5.55 \text{ J/gK})}{4(0.575 \text{ W/cmK})}}$$

Solving the above expression for $\dot{m}_{he}$, we obtain: $\dot{m}_{he}$ =0.0262 g/s, which in turn gives $Q_{in}$=0.5 W for lead B. That is, it is possible to reduce $Q_{in}$ from approximately 0.7 W to approximately 0.5 W by the use of a different design criterion, as shown in the Table, below.

| | Three 6-kA HTS Leads | | |
|---|---|---|---|
| | Conventional HTS Lead | Lead A | Lead B (min $Q_{in}$) |
| $Q_{in}$ [W] | 0.7 | 0.7 | 0.5 |
| # of BSCCO/Ag—Au tapes | 480 | 240 | 240 |
| Length of each tape [cm] | 28 | 13.7 | 18.6 |
| Total tape in lead [m] | 134 | 33 | 45 |
| Total mass of Ag [g] | 900 | 215 | 293 |
| Total mass of Au [g] | 38 | 9 | 12 |

EQUIVALENTS

While this invention has been particularly shown and described with references to preferred embodiments thereof, those skilled in the art will understand that various changes in form and details may be made therein without departing from the scope of the invention as encompassed by the appended claims including equivalents to what is therein defined. For example, although the HTS used in the above examples was BSCCO-2223, other HTS materials, such as yttrium barium copper oxide (YBCO) and BSCCO-2212, can also be used.

I claim:

1. A method for delivering current through a current lead including a high-temperature superconducting component and a normal conductive component in parallel, the method comprising the steps of:
   coupling the current lead to a superconducting device; and
   delivering electric current through the current lead under normal operating conditions at a current level above a critical current carrying capacity of the high-temperature superconducting component to generate current-sharing conductance through at least part of both the superconducting component and the normal conductive component of the current lead.

2. The method of claim 1, wherein part of the current lead conducts all of the current through the high-temperature superconducting component in a superconducting mode and a warmer part of the current lead conducts part of the current through the high-temperature superconducting component in a superconducting mode and another part of the current through the normal conductive component.

3. The method of claim 1, wherein the high-temperature superconducting component is integrally and conductively bonded to the normal conductive component.

4. The method of claim 1, wherein the normal conductive component comprises metal.

5. The method of claim 1, further comprising the step of immersing the superconducting device and a cold end of the current lead in liquid helium.

6. The method of claim 1, wherein the delivering of electric current through the current lead includes the steps of delivering electric current through a copper section of the current lead and then through a high-temperature superconducting section including the high-temperature superconducting component and the normal conductive component.

7. The method of claim 6, further comprising the step of cooling a junction of the copper section and the high-temperature superconducting section with a heat station.

8. The method of claim 7, wherein the heat station is cooled to approximately 80K.

9. A method for delivering current through an external current lead to a superconducting device, the external current lead including a high-temperature superconducting component and a normally conducting component in parallel, the method comprising the steps of:
   coupling the external current lead to the superconducting device; and delivering electric current through the external current lead to the superconducting device under normal operating conditions at a current above a critical current carrying capacity of the high-temperature superconducting component to generate current-sharing conductance through at least part of both the superconducting component and the normal conductive component of the external current lead.

* * * * *